United States Patent
Gambin et al.

(10) Patent No.: US 10,497,564 B1
(45) Date of Patent: Dec. 3, 2019

(54) NANO-IMPRINTING USING HIGH-PRESSURE CRYSTAL PHASE TRANSFORMATIONS

(71) Applicant: Northrop Grumman Systems Corporation, Falls Church, VA (US)

(72) Inventors: Vincent Gambin, Rancho Palos Verdes, CA (US); Loan T. Le, Redondo Beach, CA (US); Benjamin Poust, Hawthorne, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/286,099

(22) Filed: Feb. 26, 2019

Related U.S. Application Data

(62) Division of application No. 15/651,352, filed on Jul. 17, 2017, now abandoned.

(51) Int. Cl.
| | | |
|---|---|---|
| *G03F 7/00* | (2006.01) | |
| *H01L 21/02* | (2006.01) | |
| *H01L 21/68* | (2006.01) | |
| *H01L 21/67* | (2006.01) | |

(52) U.S. Cl.
CPC ...... *H01L 21/02667* (2013.01); *G03F 7/0002* (2013.01); *H01L 21/67092* (2013.01); *H01L 21/68* (2013.01); *H01L 21/02521* (2013.01); *H01L 21/02587* (2013.01)

(58) Field of Classification Search
None
See application file for complete search history.

(56) References Cited

U.S. PATENT DOCUMENTS

| 6,949,199 | B1 * | 9/2005 | Gauzner | G03F 7/0002 216/2 |
|---|---|---|---|---|
| 6,984,448 | B1 * | 1/2006 | Davies | B01J 3/062 117/109 |
| 7,687,007 | B2 * | 3/2010 | Ling | G03F 7/0002 101/401 |
| 2001/0036749 | A1 * | 11/2001 | Levert | B82Y 10/00 438/758 |

(Continued)

FOREIGN PATENT DOCUMENTS

JP 2001226170 A * 8/2001

OTHER PUBLICATIONS

Young, Phase Diagrams of the Elements, University of California Press, 1991, pp. 117-120 (Year: 1991).*

*Primary Examiner* — Timothy Kennedy
(74) *Attorney, Agent, or Firm* — McCracken & Gillen LLC

(57) ABSTRACT

An apparatus for nano-imprinting using a high-pressure crystal phase transformation, includes: a stamp configured to perform nano-imprinting, the stamp comprising a pedestal and a base, wherein the pedestal is shaped to match an intended shape of a device to be fabricated; a tool chuck physically connected to the stamp, the tool chuck configured to allow a user to apply one or more of pressure and temperature to the film; a substrate upon which the device can be fabricated; a thin film physically connected to the substrate; and a tool stage physically connected to the substrate, the tool stage configured to allow a user to apply one or more of pressure and temperature to the film.

8 Claims, 5 Drawing Sheets

(56) References Cited

U.S. PATENT DOCUMENTS

| | | | |
|---|---|---|---|
| 2007/0160872 A1* | 7/2007 | Iwata | B01J 3/08 428/698 |
| 2007/0190200 A1* | 8/2007 | Cherala | G03F 7/0002 425/385 |
| 2007/0290387 A1* | 12/2007 | Chen | G03F 7/0002 264/39 |
| 2009/0126589 A1* | 5/2009 | Maxwell | B81C 1/00111 101/450.1 |

* cited by examiner

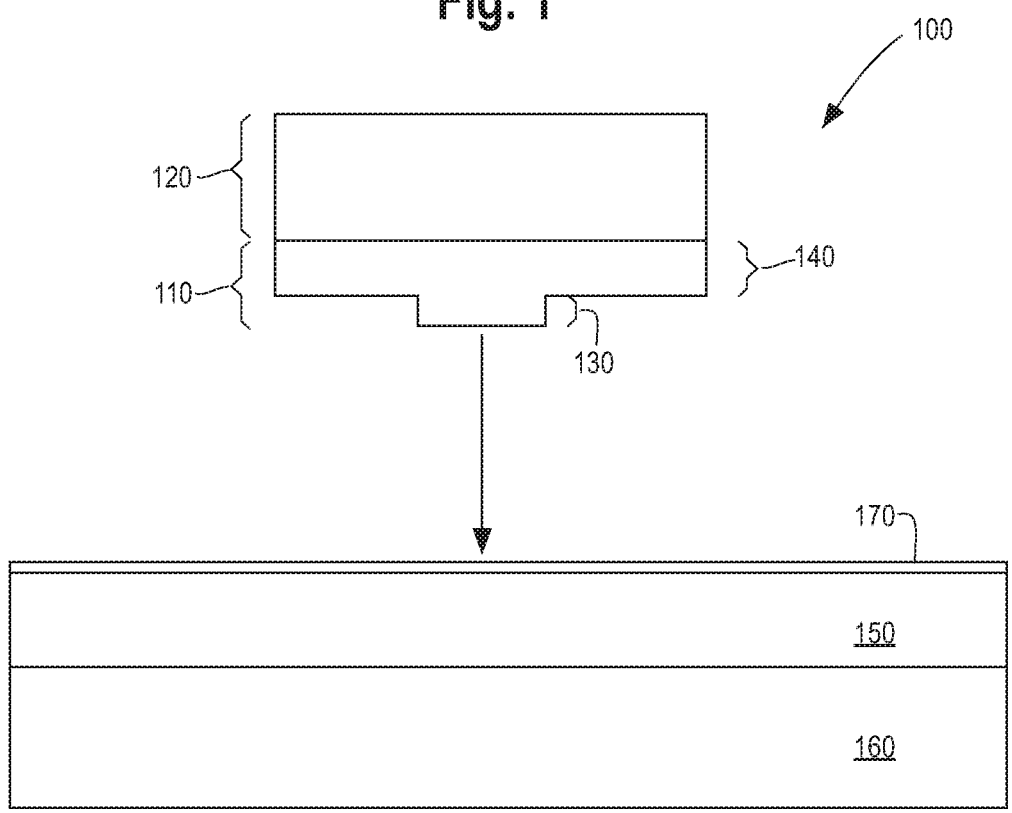

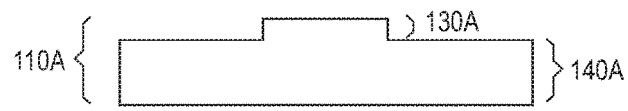
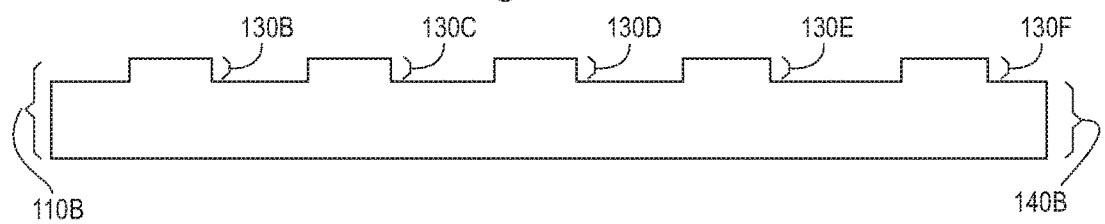
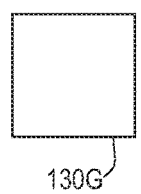 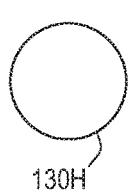 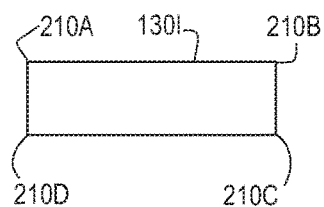 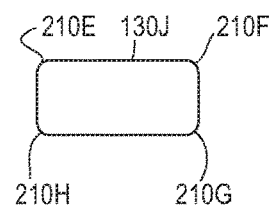
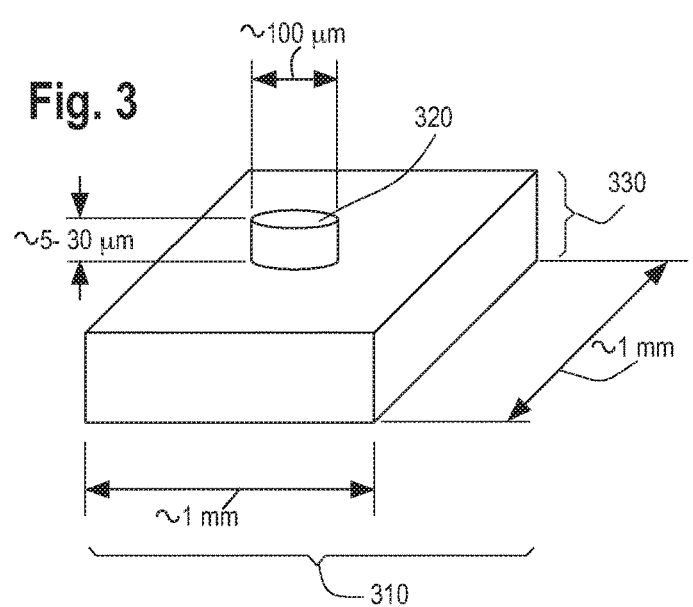

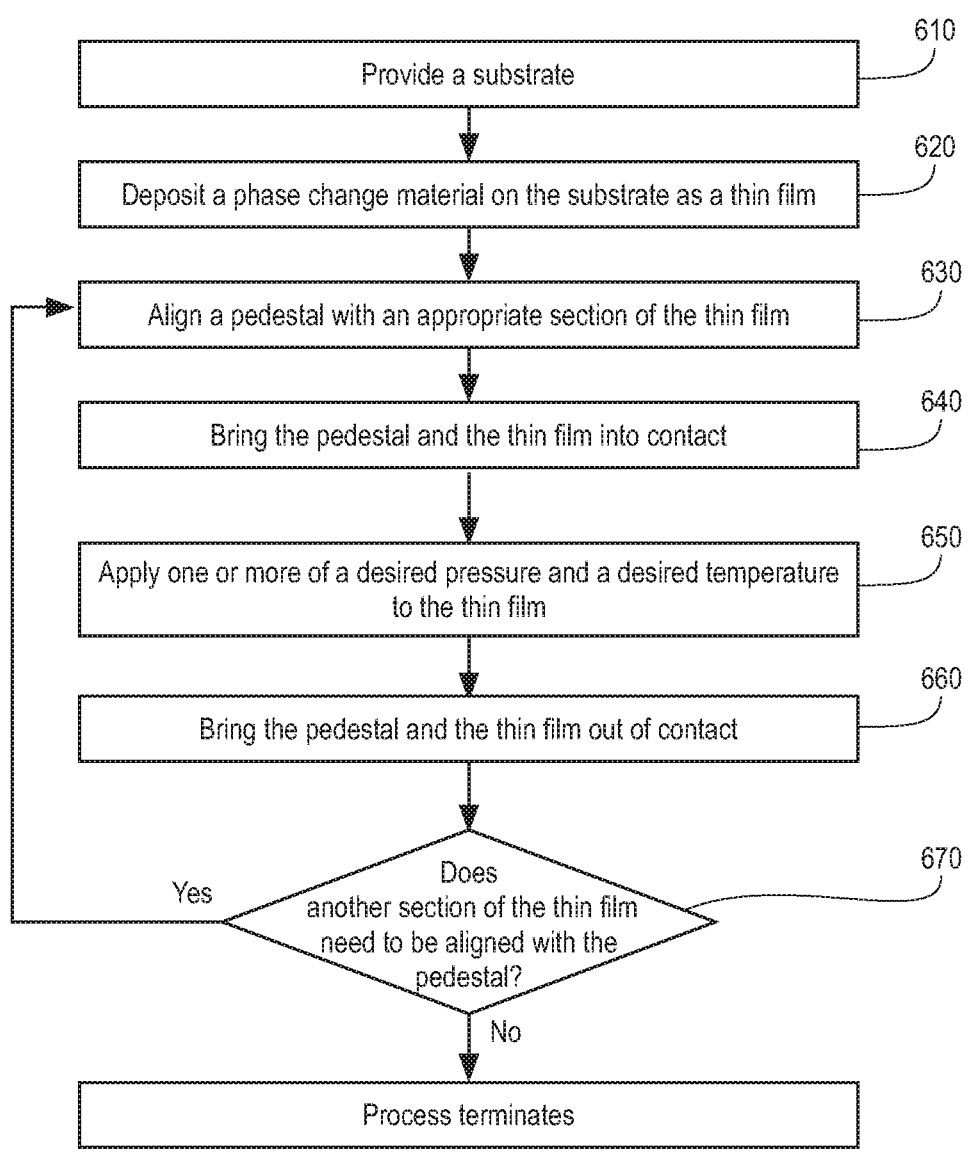

NANO-IMPRINTING USING HIGH-PRESSURE CRYSTAL PHASE TRANSFORMATIONS

CROSS REFERENCE TO RELATED APPLICATIONS

The present application is a divisional application of U.S. patent application Ser. No. 15/651,352, filed Jul. 17, 2017, entitled "Nano-Imprinting Using High-Pressure Crystal Phase Transformations", the entire contents of which are incorporated herein by reference.

SUMMARY

An apparatus for nano-imprinting using a high-pressure crystal phase transformation includes: a stamp configured to perform nano-imprinting, the stamp comprising a pedestal and a base, wherein the pedestal is shaped to match an intended shape of a device to be fabricated; a tool chuck physically connected to the stamp, the tool chuck configured to allow a user to apply one or more of pressure and temperature to the film through the stamp; a substrate upon which the device can be fabricated; a thin film physically connected to the substrate; and a tool stage physically connected to the substrate, the tool stage configured to allow a user to apply one or more of pressure and temperature to the film through the substrate.

A method for nano-imprinting using a high-pressure crystal phase transformation includes the steps of: providing a substrate upon which a device can be fabricated; depositing a phase change material on the substrate as a thin film; aligning a pedestal configured to perform nano-imprinting with an appropriate section of the thin film; bringing the pedestal and the thin film into contact; applying one or more of a desired pressure and a desired temperature, using one or more of a tool stage physically connected to the substrate and a tool chuck physically connected to the pedestal, the one or more of a tool stage and a tool chuck configured to allow a user to apply one or more of pressure and temperature to the thin film; bringing the pedestal and the substrate out of contact; and querying whether another section of the substrate needs to be aligned with the pedestal and if yes, return to the aligning step.

DESCRIPTION OF THE DRAWINGS

The accompanying drawings provide visual representations which will be used to more fully describe various representative embodiments and can be used by those skilled in the art to better understand the representative embodiments disclosed herein and their inherent advantages. In these drawings, like reference numerals identify corresponding elements.

FIG. 1 is a drawing showing a side view of a system for nano-imprinting using high-pressure crystal phase transformations.

FIGS. 2A-2F are a set of drawings showing pedestals used by a system for nano-imprinting using high-pressure crystal phase transformations.

FIG. 3 is a drawing showing components of a stamp comprising a circular pedestal used by a system for nano-imprinting using high-pressure crystal phase transformations.

FIG. 6 is a flowchart of a method for nano-imprinting using high-pressure crystal phase transformations.

DETAILED DESCRIPTION

Figure 4A:
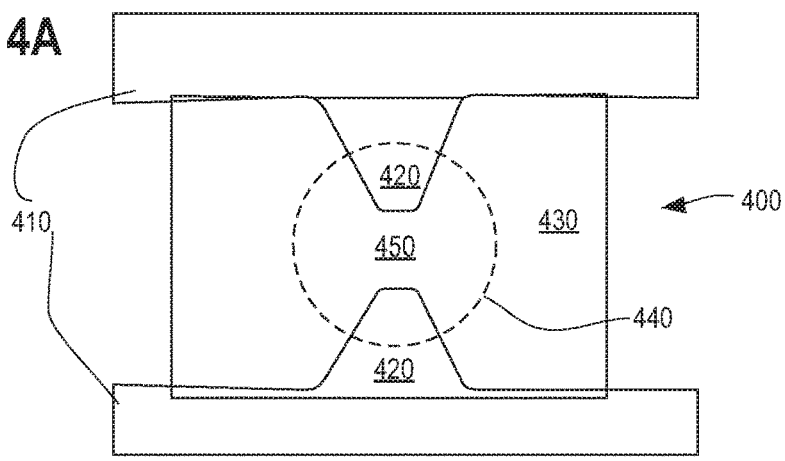
FIGS. 4A-4C are a set of drawings showing top views of steps in a method for nano-imprinting using high-pressure crystal phase transformations.

While the present invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described.

According to embodiments of the invention, a method and apparatus are provided for nano-imprinting using high-pressure crystal phase transformations. For example, a method and apparatus are provided for transforming high-pressure phases of a thin film in one or more patterned regions across a wafer within a device at a nanometer to millimeter scale. One or more of pressure and temperature are applied. For example, the device comprises one or more of an electronic device, an optical device and an opto-electronic device.

For example, pressure is applied to the thin film. For example, pressure is applied to the thin film rapidly. For example, the pressure is concentrated on a small stamping pedestal. For example, a pressure is applied to the thin film of between approximately 0.1 GigaPascal (0.1 GPa) and approximately 100 GPa. For example, the pressure is applied to the thin film over a time between approximately 0.1 seconds and approximately 10 minutes. For example, a pressure of approximately 10 GPa is applied to the thin film for approximately 10 seconds. For example, the pressure profile varies over the time during which the pressure is applied to the thin film. The pressure profile may be configured to the particular device to be produced.

For example, temperature is applied to the thin film. For example, temperature is applied to the thin film rapidly. For example, a temperature is applied to the thin film of between approximately 0 degrees Celsius (0° C.) and approximately 1,500 degrees Celsius (1,500° C.). For example, the temperature is applied to the thin film over a time between approximately 0.1 seconds and approximately 10 minutes. For example, a temperature of approximately 300° C. is applied to the thin film for approximately 10 seconds. For example, a temperature of approximately 70° C. is applied to the thin film for approximately 10 minutes. For example, the temperature profile varies over the time during which the temperature is applied to the thin film. The temperature profile may be configured to the particular device to be produced.

The pedestal and the high pressure induces a phase transformation in a phase change material. Phase change materials are materials that have the property that a phase produced by application of higher pressure remains substantially stable even after the pressure is substantially released. For example, the phase change material comprises a phase-change material able to undergo a solid-solid phase change. For example, the phase change material is configured to hold its state after the stamp is removed.

Examples of phase change materials that experience phase transformations at high pressures include but are not limited to arsenic, arsenic monophosphide (AsP), vanadium oxide, phosphorus, hexagonal boron nitride, cubic boron nitride, diamond, and gallium nitride (GaN).

For example, a pressure is applied to the thin film of between approximately 1 GigaPascals (1 GPa) and approximately 100 GPa. Typically, although not necessarily, a phase change material is a crystalline material. Typically, although not necessarily, a phase change material has a phase change pressure of between approximately 5 GPa and approximately 50 GPa.

This invention will enable spatially-aligned intra-device crystal conversion across a substrate to enabled interesting and unique electronic, optical and mechanical properties.

According to embodiments of the invention, a thin film deposition technique is used to deposit the material on the substrate. For example, the thin film deposition technique comprises one or more of chemical vapor deposition (CVD), molecular beam epitaxy (MBE), thermal deposition, plasma-enhanced deposition, electron beam deposition, sputtering, and spin-casting. Optionally, the thin film deposition technique uses a catalyst.

FIG. 1 is a drawing showing a side view of a system 100 for nano-imprinting using high-pressure crystal phase transformations.

The system 100 comprises a stamp 110 that is physically connected to a tool chuck 120. The stamp 110 comprises a pedestal 130 and a base 140. For example, and as depicted, the pedestal 130 is shaped to match an intended shape of a device to be fabricated. For example, the pedestal comprises intended shapes of devices to be fabricated. For example, the pedestal comprises a larger area surrounding shapes of devices to be fabricated. For example, the stamp comprises more than one pedestal.

The tool chuck 120 is configured to allow a user to apply one or more of pressure and temperature to the thin film through the stamp 110. For example, the tool chuck 120 comprises one or more of a semiconductor wafer bonder (not shown), a die-attach bonder (not shown), and a nano-imprinter (not shown).

The tool chuck 120 further comprises a motor (not shown). The tool chuck 120 is further configured to move the stamp 110 into a desired position using the motor. The tool chuck 120 is further configured to withstand pressure without breaking. The tool chuck 120 is further configured to detect a temperature of the stamp 110.

The system 100 further comprises a substrate 150 upon which a device can be fabricated. The substrate is physically connected to a tool stage 160. The substrate 150 comprises one or more of metal, dielectric, semiconductor and another substrate material. For example, the substrate 150 consists of the semiconductor. The substrate comprises one or more of silicon, silicon carbide, sapphire, diamond, silicon nitride, quartz, silicon dioxide, aluminum nitride, glass, and another material. The stamp comprises one or more of silicon, silicon carbide, sapphire, diamond, silicon nitride, quartz, silicon dioxide, aluminum nitride, glass, and another material. The base comprises one or more of silicon, silicon carbide, sapphire, diamond, silicon nitride, quartz, silicon dioxide, aluminum nitride, glass, and another material.

For example, the substrate 150 may have a thickness between approximately 10 microns and approximately 1,000 microns. For example, the substrate is pre-patterned. For example, the substrate is pre-patterned with one or more electrodes.

The surface of the substrate is coated with a thin film 170. For example, the thin film 170 has a thickness of between approximately 1 angstrom and 10 microns. For example, the thin film 170 has a thickness of approximately 1 micron. The thin film 170 comprises a phase change material. For example, the thin film 170 comprises one or more of arsenic, arsenic monophosphide (AsP), vanadium oxide, phosphorus, hexagonal boron nitride, cubic boron nitride, diamond, gallium nitride (GaN), and another phase change material.

The tool stage 160 is configured to allow a user to apply one or more of pressure and temperature to the film through the substrate 150. For example, the tool stage 160 comprises one or more of a semiconductor wafer bonder (not shown), a die-attach bonder (not shown), and a nano-imprinter (not shown).

The tool stage 160 further comprises a motor (not shown). The tool stage 160 is further configured to move the substrate into a desired position using the motor. The tool stage 160 is further configured to withstand pressure without breaking. The tool stage 160 is further configured to detect a temperature of the substrate.

For example, the base has an area of between approximately 0.1 square millimeters ($0.1\ mm^2$) and approximately 1 square centimeter ($1\ cm^2$). For example, the pedestal has an area of between approximately 25 square microns ($25\ \mu m^2$) and approximately 1,000 square microns ($1,000\ \mu m^2$). For example, the pedestal has an area less than or equal to approximately 1% of the area of the base. For example, the pedestal has an area less than or equal to approximately 0.1% of the area of the base. A ratio of a cross-section of the base to a cross-section of the pedestal provides a force-multiplier effect increasing the force on the thin film.

As one example, when the phase change material comprises phosphorus, pressure is preferably applied to the thin film through the stamp and not through the substrate, and temperature is preferably not applied, helping to keep the phosphorus from doing one or more of evaporating and sublimating, by confining the phosphorus, which is sealed off by the stamp.

FIGS. 2A-2F are a set of drawings showing pedestals used by a system for nano-imprinting using high-pressure crystal phase transformations.

FIGS. 2A-2B are a pair of drawings showing top views of pedestals used by the system for nano-imprinting using high-pressure crystal phase transformations. FIG. 2A is a drawing showing a single-pedestal stamp 110A in profile. Visible are components of the stamp 110A including the base 140A and a single pedestal 130A. The single pedestal 130A has a shape that is one of substantially rectangular and substantially square. The pedestal 130A is shaped to match an intended shape of the device to be fabricated.

FIG. 2B is a drawing showing a multiple-pedestal stamp 110B in profile. Visible are components of the stamp 110B including the base 140B and five pedestals 130B-130F. Each of the five pedestals 130B-130F has a shape that is one of substantially rectangular and substantially square. For example, pedestals 130B and 130D may be substantially square and pedestals 130C, 130E and 130F may be substantially rectangular. According to additional variations, pedestals can have an arbitrary shape such as, for example, an oval, a rhombus, a trapezoid, and another shape to match an intended shape of the device to be fabricated.

FIGS. 2C-2F are four drawings showing side views of pedestals used by the system for nano-imprinting using high-pressure crystal phase transformations. FIG. 2C is a drawing showing an end view of a pedestal 130G. The pedestal 130G has a shape that is substantially square.

FIG. 2D is a drawing showing an end view of a pedestal 130H. The pedestal 130H has a shape that is substantially circular.

FIG. 2E is a drawing showing an end view of a pedestal 130I. The pedestal 130I has a shape that is substantially rectangular, the shape comprising sharp corners 210A-210D.

FIG. 2F is a drawing showing an end view of a pedestal 130J. The pedestal 130J has a shape that is substantially rectangular, the shape comprising beveled corners 210E-210H.

FIG. 3 is a drawing showing components of a stamp 310 comprising a circular pedestal 320 used by a system for nano-imprinting using high-pressure crystal phase transformations.

The stamp 310 comprises silicon carbide. The stamp 310 further comprises the pedestal 320 and the base 330. The pedestal 320 is approximately circular. The pedestal 320 has a generally smooth top surface. The pedestal 320 has an approximate diameter of 100 microns (100 μm) and a thickness of between approximately 5 μm and approximately 30 μm. The base 330 has dimensions of approximately 1 millimeter (1 mm) by approximately 1 mm. The base 330 has a thickness between approximately 5 microns (5 μm) and approximately 30 microns (30 μm).

A manufacturing method is provided for materials with unique crystallographic phases that is compatible with modern semiconductor manufacturing processes.

Figure 4B:
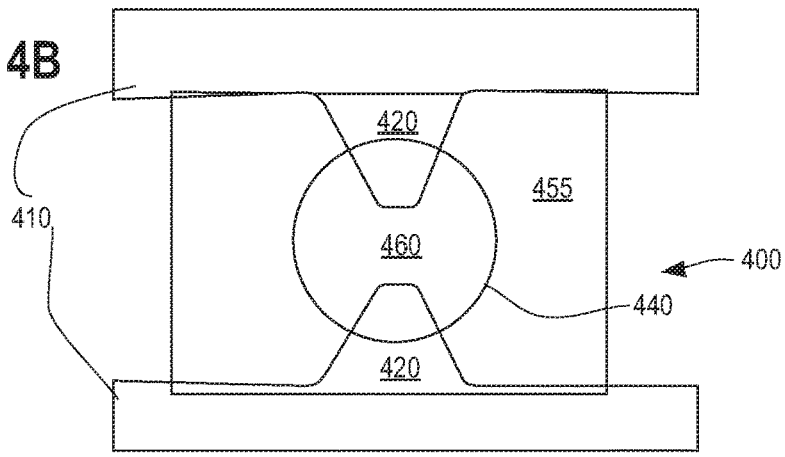
Figure 4C:
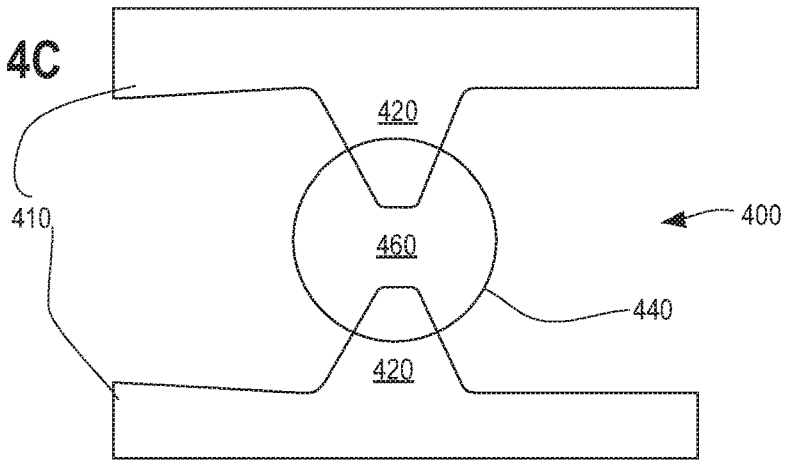

FIGS. 4A-4C are a set of drawings showing top views in steps in a method for nano-imprinting using high-pressure crystal phase transformations.

In FIG. 4A, a device 400 comprises a substrate 410. The substrate 410 comprises electrodes that are pre-patterned on the substrate 410. A pedestal 420 is also depicted. FIG. 4A depicts a time after a thin film has been deposited on the pre-patterned substrate, and after the pedestal 420 has been brought into contact with the thin film 430, but prior to conversion of the thin film 430. In this example, the thin film 430 comprises red phosphorus. A dotted line 440 surrounds a region 450 in which conversion of the phase change material will occur. In FIG. 4A, the region 450 is approximately circular.

Optionally, prior to applying one or more of pressure and temperature to the thin film, a non-stick coating is applied to the thin film. This inhibits a tendency of the thin layer to adhere following the application of the one or more of pressure and temperature to one or more of the substrate 410 and the pedestal. For example, the non-stick coating comprises graphite. For example, the non-stick coating comprises graphene.

In FIG. 4B, the same device 400 is depicted following conversion of the phase change material. Again depicted are the substrate 410, the pedestal 420, a region of the thin film 430 comprising red phosphorus that is unconverted, and the approximately circular line 440. Outside the approximately circular region 460, the red phosphorus remains in a form of red phosphorus and is not converted to black phosphorus. This portion of the device 400 is typically an undesired region 455 of the thin film 430. The approximately circular region 460 now comprises phosphorus that has converted to black phosphorus under the one or more of high pressure and high temperature.

In FIG. 4C, the same device 400 is depicted following an optional step of removing the undesired region (not shown) of the thin film. Again depicted are the substrate 410, the pedestal 420, and the approximately circular line 440 outlining the converted black phosphorus.

Figure 5:
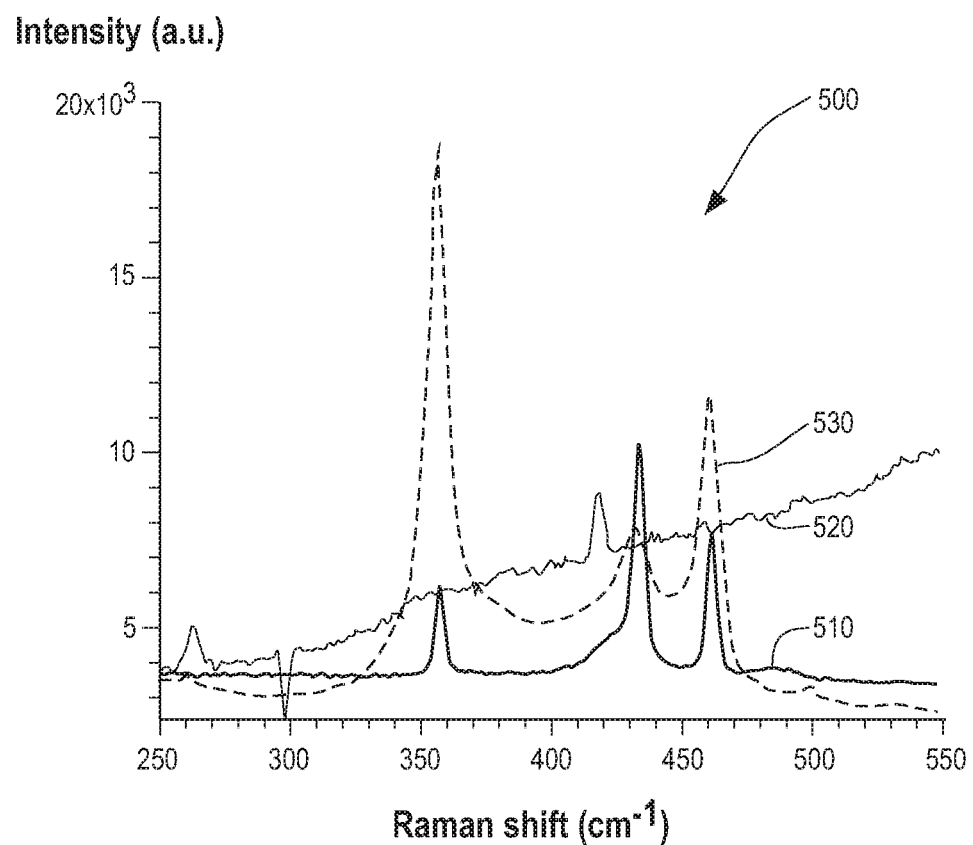
FIG. 5 is a plot of intensity against Raman shift for a system and method for nano-imprinting using high-pressure crystal phase transformations and for reference off-the-shelf black phosphorus.

FIG. 5 is a plot 500 of experimental data generated for intensity (arbitrary units) against Raman shift ($cm^{-1}$) for a system and method for nano-imprinting using high-pressure crystal phase transformations and for the prior art. The data in FIG. 5 was generated using phosphorus as the phase change material. FIG. 5 demonstrates a working embodiment of the invention that spectroscopically demonstrates proof of the phase transition and proof of the crystallization of the phase change material. The ratio of the intensities of the different peaks depends, among other factors, on the thickness of a given sample. The solid curve 510 represents reference off-the-shelf exfoliated bulk black phosphorus. The dotted curve 520 represents amorphous CVD red phosphorus lacking a crystal structure, prior to phase transformation. The dashed curve 530 represents experimentally obtained data for crystallized black phosphorus after a phase transformation produced using embodiments of the invention.

FIG. 6 is a flowchart of a method 600 for nano-imprinting using high-pressure crystal phase transformations. The order of the steps in the method 600 is not constrained to that shown in FIG. 6 or described in the following discussion. Several of the steps could occur in a different order without affecting the final result.

In step 610, a substrate is provided. For example, the substrate comprises a bare substrate. For example the substrate comprises a processed wafer populated with one or more components. Block 610 then transfers control to block 620.

In step 620, a phase change material is deposited on the substrate as a thin film. For example, the phase change material comprises one or more of arsenic, arsenic monophosphide (AsP), vanadium oxide, phosphorus, hexagonal boron nitride, cubic boron nitride, diamond, gallium nitride (GaN), and another phase change material. The deposition uses any thin film deposition technique suitable for the phase change material. For example, the deposition is performed using one or more of CVD, MBE, thermal deposition, spin on, and another deposition technique. For example, the deposition is performed in a blanket fashion substantially across the entire substrate. For example, the deposition is performed in selected areas of the substrate. For example, the depositing is performed using a catalyst. Block 620 then transfers control to block 630.

In step 630, a pedestal is aligned with an appropriate section of the thin film that will be undergoing a phase transformation. The pedestal forms part of a stamp. For example, the stamp comprises one or more of silicon, silicon carbide, sapphire, diamond, silicon nitride, quartz, silicon dioxide, aluminum nitride, and another material. Block 630 then transfers control to block 640.

In step 640, the pedestal and the thin film are brought into contact.

In step 650, one or more of a desired pressure and a desired temperature is applied to the thin film. For example, the pressure is applied to the thin film using one or more of a semiconductor wafer bonder, a die-attach bonder, and a nano-imprinter. For example, the pressure is applied to the thin film of between approximately 1 GigaPascals (1 GPa) and approximately 100 GPa. For example, the desired temperature is applied to the pedestal and transmitted from the pedestal to the thin film. For example, the desired temperature is applied to the substrate and transmitted from the stamp to the pedestal to the thin film. For example, the desired temperature is applied to both the stamp and the substrate and transmitted from the stamp to the pedestal to the thin film and transmitted from the substrate to the thin film. For example, one or more of the temperature profile over time and the pressure profile over time is applied to one or more of the stamp and the substrate and transmitted from the stamp to the pedestal to the thin film. One or more of the temperature profile and the pressure profile are selected so as to control for one or more of a desired grain size, a desired grain growth profile, desired diffusion, and another variable of interest. Block 650 then transfers control to block 660.

In block 660, the pedestal and the thin film are brought out of contact. Block 660 then transfers control to block 670.

In block 670, it is queried whether another section of the thin film needs to be aligned with the pedestal. Typically, the process steps across the water by repeating steps 630, 640 and 650 as many times as needed. Accordingly if the answer is yes, the process returns to step 630. Alignment targets on substrate to guide automated stamping across wafer. Alternatively, the stamp can be manufactured to permit simultaneous conversion of multiple targets on the substrate. FIG. 2B provides an example of how this might be done according to embodiments of the invention. If the answer is no, block 670 terminates the process.

Optionally, as a step following step 620 and preceding step 640, a non-stick coating is applied to the thin film. For example, the non-stick coating comprises graphite. For example, the non-stick coating comprises graphene. The non-stick coating facilitates removal of the thin film following step 650. This optional step may be performed either immediately after step 620 and immediately before step 630, or immediately after step 630 and immediately before step 640.

Optionally, as a final step in the process following step 650, further processing of the device may be performed. The further processing may comprise removing undesired regions of the thin film. For example, the further processing can be performed using one or more semiconductor processing techniques. For example, the further processing comprises one or more of dry chemical etching, wet chemical etching, film deposition, ion implantation, contact deposition, active device formation, and other further processing.

According to embodiments of the invention, wafer-scale conversion of 2D materials (for example, black phosphorus) can be achieved using standard semiconductor processing technologies. Embodiments of the invention can be seamlessly integrated into existing semiconductor manufacturing processes. Embodiments of the invention enable nanometer-scale spatially-aligned recrystallization or phase transformation of high-pressure phases, precisely targeted in one or more of an active device region and passive functional structures. Embodiments of the invention enable nanometer-scale spatially-aligned recrystallization or phase transformation of high-pressure phases, stamped out across an entire substrate.

Embodiments of the invention enable semiconductor material transitions from an indirect gap to a direct gap. Embodiments of the invention enable conversion of device-active material from semiconductor to metal (or from metal to semiconductor) to reduce access resistance to the device. Embodiments of the invention avoid problems of current black phosphorus synthesis methods including limited sample size and contaminants such as Bi and $SnI_4$ that are generated as byproducts of the current methods.

Embodiments of the invention also permit large-scale synthesis of high-pressure 2D thin films usable in semiconductor device fabrication. Embodiments of the invention allow seamless integration of these materials into intrinsic and extrinsic regions of devices such as transistors, light-emitting diodes, logic circuits, photo-detectors, and the like. Embodiments of the invention provide a solution that is orders of magnitude less expensive than current approaches. Embodiments of the invention permit wafer-level transformation of thin films into a shape of the device. Embodiments of the invention provide the ability to raster across the entire semiconductor wafer, quickly patterning many positions on the wafer. Embodiments of the invention allow applying a relatively small force on the base, the force on the thin film then being greatly multiplied under the force-multiplier effect.

While the above representative embodiments have been described with certain components in exemplary configurations, it will be understood by one of ordinary skill in the art that other representative embodiments can be implemented using different configurations and/or different components. For example, it will be understood by one of ordinary skill in the art that the thin film 170 may be physically connected to the pedestal 130 instead of the substrate 150.

The representative embodiments and disclosed subject matter, which have been described in detail herein, have been presented by way of example and illustration and not by way of limitation. It will be understood by those skilled in the art that various changes may be made in the form and details of the described embodiments resulting in equivalent embodiments that remain within the scope of the invention. It is intended, therefore, that the subject matter in the above description shall be interpreted as illustrative and shall not be interpreted in a limiting sense.

What is claimed is:

1. A method for nano-imprinting at least portions of a semiconducting device comprising the steps of:
   depositing a phase change material capable of undergoing a solid-to-solid phase change as thin film on a substrate;
   aligning a pedestal configured to perform nano-imprinting with an appropriate section of the thin film, wherein the pedestal is shaped to match an intended shape of at least a component of the semiconducting device and wherein the thin film is one of arsenic, arsenic monophosphide, vanadium oxide, phosphorus, hexagonal boron nitride, cubic boron nitride, diamond, and gallium nitride;
   bringing the pedestal and the thin film into contact;
   applying one or more of a desired pressure and a desired temperature, using one or more of a tool stage physically connected to the substrate and a tool chuck physically connected to the pedestal, the one or more of a tool stage and a tool chuck configured to allow a user to apply one or more of a predetermined pressure and temperature to the appropriate section of the thin film to cause a solid-to-solid phase conversion in the appropriate section of the thin film so that the appropriate section has electrical conductivity that is substantially different than electrical conductivity of the thin film outside the appropriate section; and
   bringing the pedestal and the thin film out of contact.

2. The method of claim 1, wherein the thin film material is a crystalline material having a thickness of between approximately 1 angstrom and 10 microns.

3. The method of claim 1, wherein the appropriate section of the thin film material has one of an indirect semiconductor gap transition to a direct semiconductor gap transition before the conversion and the other of the indirect semiconductor gap transition to the direct semiconductor gap transition after the conversion.

4. The method of claim 1, wherein the applying step comprises applying a temperature of between approximately 0 degrees Celsius (0° C.) and approximately 1,500 degrees Celsius (1,500° C.).

5. The method of claim 4, wherein the applying step comprises applying the temperature over a time between approximately 0.1 seconds and approximately 10 minutes.

6. The method of claim 1, wherein the depositing step comprises depositing the thin film material across regions of a semiconductor wafer to provide seamless integration with additional conventional semiconducting wafer processing.

7. The method of claim 1, further comprising an additional step, performed after the step of depositing and before the step of bringing the pedestal and the substrate into contact, of:

placing a non-stick coating on the thin film.

8. The method of claim 1, further comprising an additional step, performed after the step of bringing the pedestal and the thin film out of contact, of:

performing further processing to remove non-converted areas of the thin film.

* * * * *